United States Patent
Su et al.

(10) Patent No.: US 9,293,442 B2
(45) Date of Patent: Mar. 22, 2016

(54) SEMICONDUCTOR PACKAGE AND METHOD

(71) Applicant: Taiwan Semiconductor Manufacturing Company, Ltd., Hsin-Chu (TW)

(72) Inventors: An-Jhih Su, Bade (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/276,784

(22) Filed: May 13, 2014

(65) Prior Publication Data

US 2015/0255431 A1 Sep. 10, 2015

Related U.S. Application Data

(60) Provisional application No. 61/949,755, filed on Mar. 7, 2014.

(51) Int. Cl.
*H01L 23/48* (2006.01)
*H01L 25/065* (2006.01)
*H01L 23/00* (2006.01)
*H01L 25/10* (2006.01)

(52) U.S. Cl.
CPC ............ *H01L 25/0657* (2013.01); *H01L 24/17* (2013.01); *H01L 24/19* (2013.01); *H01L 24/20* (2013.01); *H01L 24/69* (2013.01); *H01L 24/81* (2013.01); *H01L 25/105* (2013.01); *H01L 2224/0401* (2013.01); *H01L 2224/04105* (2013.01); *H01L 2224/12105* (2013.01); *H01L 2224/1703* (2013.01); *H01L 2225/1035* (2013.01); *H01L 2225/1041* (2013.01); *H01L 2225/1058* (2013.01); *H01L 2924/12042* (2013.01); *H01L 2924/15311* (2013.01); *H01L 2924/181* (2013.01); *H01L 2924/3511* (2013.01)

(58) Field of Classification Search
CPC .............. H01L 23/481; H01L 23/5386; H01L 23/5389; H01L 24/19; H01L 24/11; H01L 25/105; H01L 21/6836; H01L 2224/04105; H01L 2224/12105; H01L 2224/32145; H01L 2224/32225; H01L 2224/48091; H01L 2224/48227
USPC .................................. 257/758, 773–774, 777
See application file for complete search history.

(56) References Cited

U.S. PATENT DOCUMENTS

| | | | |
|---|---|---|---|
| 6,333,561 B1 | 12/2001 | Chen | |
| 6,555,906 B2 | 4/2003 | Towle et al. | |
| 7,619,901 B2 | 11/2009 | Eichelberger et al. | |
| 8,039,303 B2 | 10/2011 | Shim et al. | |
| 8,072,059 B2 | 12/2011 | Shim et al. | |

(Continued)

FOREIGN PATENT DOCUMENTS

| | | |
|---|---|---|
| DE | 10110453 A1 | 5/2002 |
| DE | 102005040213 A1 | 3/2006 |

(Continued)

*Primary Examiner* — Dung Le
(74) *Attorney, Agent, or Firm* — Slater & Matsil, L.L.P.

(57) ABSTRACT

A first package is bonded to a second package with a structural member located between the first package and the second package for structural support. In an embodiment the structural member is a plate or one or more conductive balls. Once the structural member is in place, the first package is bonded to the second package.

20 Claims, 9 Drawing Sheets

(56) References Cited

U.S. PATENT DOCUMENTS

| | | | |
|---|---|---|---|
| 8,097,490 B1 | 1/2012 | Pagaila et al. | |
| 8,133,762 B2 * | 3/2012 | Pagaila et al. | 438/117 |
| 8,193,604 B2 * | 6/2012 | Lin et al. | 257/531 |
| 8,330,273 B2 | 12/2012 | Brunnbauer et al. | |
| 8,354,304 B2 | 1/2013 | Chow et al. | |
| 8,361,842 B2 | 1/2013 | Yu et al. | |
| 8,474,133 B2 | 7/2013 | Eichelberger et al. | |
| 8,476,824 B2 | 7/2013 | Yu et al. | |
| 8,680,647 B2 | 3/2014 | Yu et al. | |
| 8,703,542 B2 | 4/2014 | Lin et al. | |
| 8,741,690 B2 | 6/2014 | Meyer et al. | |
| 8,742,579 B2 | 6/2014 | Pagaila et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,796,846 B2 | 8/2014 | Lin et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,000,583 B2 | 4/2015 | Haba et al. | |
| 9,048,222 B2 | 6/2015 | Hung et al. | |
| 2007/0287230 A1 | 12/2007 | Kuramochi et al. | |
| 2008/0157330 A1 | 7/2008 | Kroehnert et al. | |
| 2009/0236752 A1 | 9/2009 | Lee et al. | |
| 2011/0193216 A1 | 8/2011 | Lin et al. | |
| 2011/0291288 A1 | 12/2011 | Wu et al. | |
| 2012/0119378 A1 | 5/2012 | Ng et al. | |
| 2012/0199981 A1 | 8/2012 | Jeong et al. | |
| 2012/0319284 A1 | 12/2012 | Ko et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0297981 A1 | 11/2013 | Gu et al. | |
| 2013/0307140 A1 | 11/2013 | Huang et al. | |
| 2014/0110840 A1 | 4/2014 | Wojnowski et al. | |
| 2014/0203429 A1 | 7/2014 | Yu et al. | |
| 2014/0203443 A1 | 7/2014 | Pagaila et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |

FOREIGN PATENT DOCUMENTS

| | | |
|---|---|---|
| DE | 102005043557 A1 | 9/2006 |
| DE | 102011001405 A1 | 10/2011 |

* cited by examiner

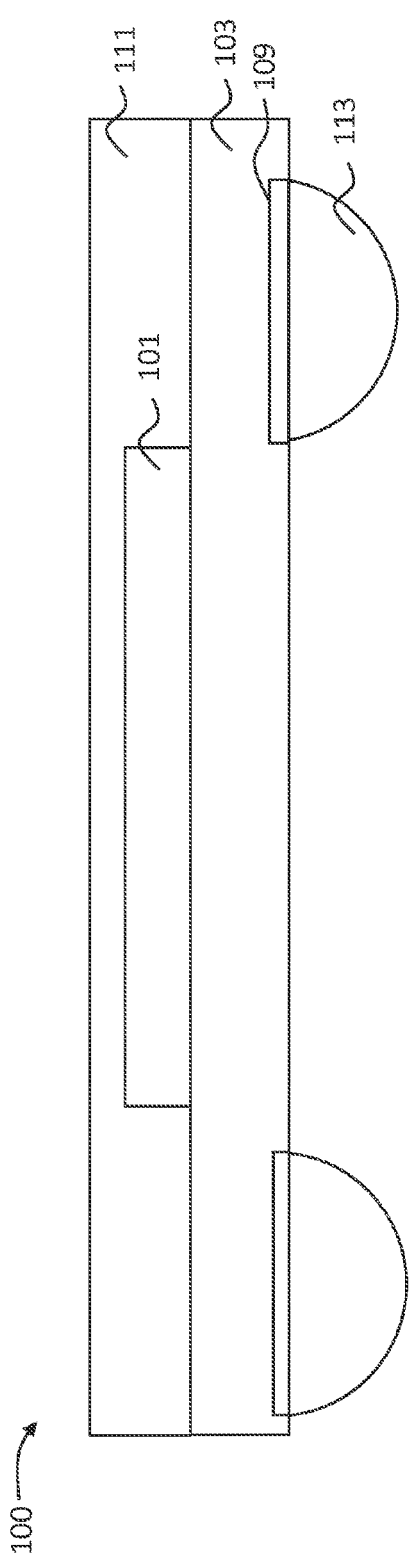
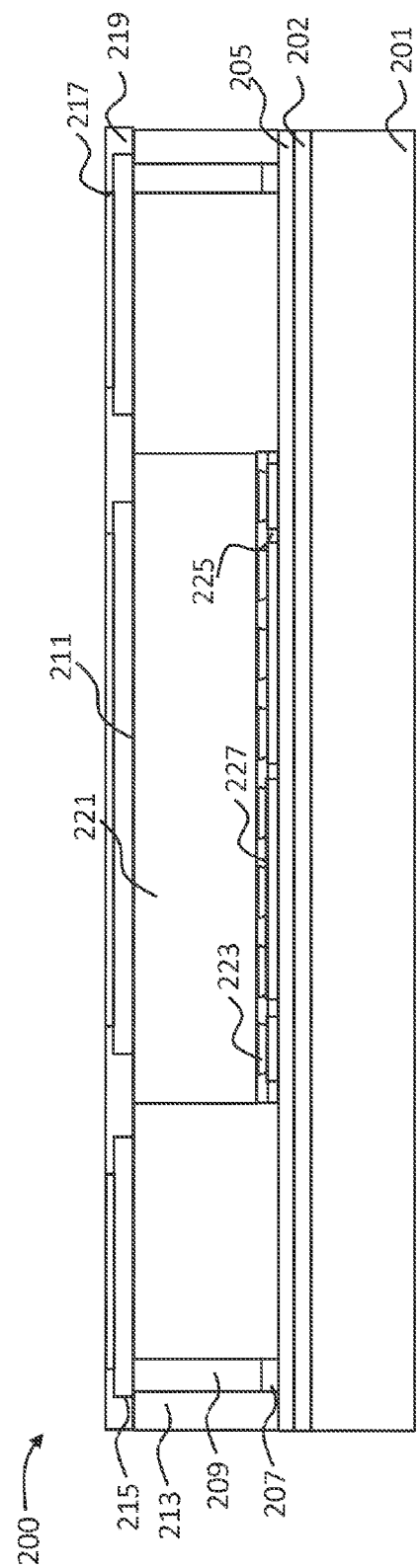
Figure 1
Figure 2A

SEMICONDUCTOR PACKAGE AND METHOD

PRIORITY CLAIM AND CROSS-REFERENCE

This application claims the benefit of U.S. Provisional Patent Application Ser. No. 61/949,755, filed on Mar. 7, 2014, and entitled "Semiconductor Package and Methods of Forming Same," which application is incorporated herein by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are utilized.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a first package in accordance with some embodiments.

FIGS. 2A-2B illustrate a second package in accordance with some embodiments.

DETAILED DESCRIPTION

Figure 2B:
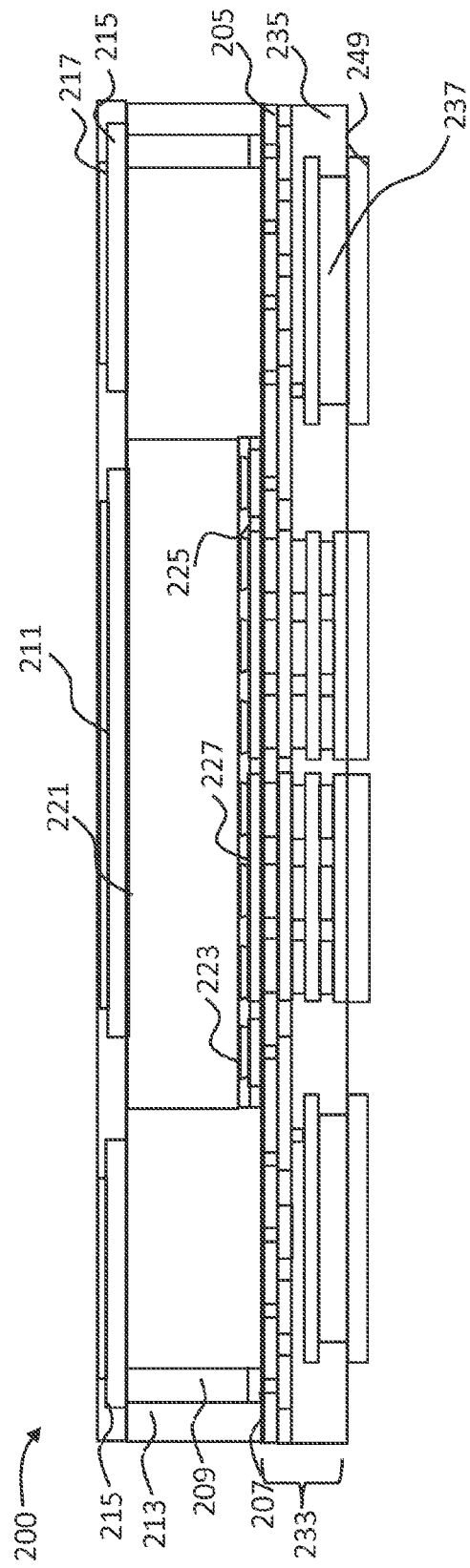

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference now to FIG. 1, there is shown a first package 100. The first package 100 may comprise a first substrate 103, a first semiconductor device 101, first contact pads 109, a first encapsulant 111, and first external connections 113. In an embodiment the first substrate 103 may be, e.g., a packaging substrate comprising internal interconnects to connect the first semiconductor device 101 to other external devices such as a second package 200 (not illustrated in FIG. 1 but illustrated and described below with respect to FIGS. 2A-2B).

Alternatively, the first substrate 103 may be an interposer used as an intermediate substrate to connect the first semiconductor device 101 to the other external devices. In this embodiment the first substrate 103 may be, e.g., a silicon substrate, doped or undoped, or an active layer of a silicon-on-insulator (SOI) substrate. However, the first substrate 103 may alternatively be a glass substrate, a ceramic substrate, a polymer substrate, or any other substrate that may provide a suitable protection and/or interconnection functionality. These and any other suitable materials may alternatively be used for the first substrate 103.

The first semiconductor device 101 may be a semiconductor device designed for an intended purpose such as being a logic die, a central processing unit (CPU) die, a memory die, combinations of these, or the like. In an embodiment the first semiconductor device 101 comprises integrated circuit devices, such as transistors, capacitors, inductors, resistors, first metallization layers (not shown), and the like, therein, as desired for a particular functionality. In an embodiment the first semiconductor device 101 is designed and manufactured to work in conjunction with or concurrently with a second semiconductor device 211 (not illustrated in FIG. 1 but illustrated and described below with respect to FIGS. 2A-2B).

The first contact pads 109 may be formed on the first substrate 103 to form electrical connections between the first semiconductor device 101 and, e.g., the first external connections 113. In an embodiment the first contact pads 109 may be formed over and in electrical contact with electrical routing (not separately illustrated in FIG. 1) within the first substrate 103. The first contact pads 109 may comprise aluminum, but other materials, such as copper, may alternatively be used. The first contact pads 109 may be formed using a deposition process, such as sputtering, to form a layer of material (not shown) and portions of the layer of material may then be removed through a suitable process (such as photolithographic masking and etching) to form the first contact pads 109. However, any other suitable process may be utilized to form the first contact pads 109. The first contact pads 109 may be formed to have a thickness of between about 0.5 μm and about 4 μm, such as about 1.45 μm.

The first encapsulant 111 may be used to encapsulate and protect the first semiconductor device 101 and the first substrate 103. In an embodiment the first encapsulant 111 may be a molding compound and may be placed using a molding device (not illustrated in FIG. 1). For example, the first substrate 103 and the first semiconductor device 101 may be placed within a cavity of the molding device, and the cavity may be hermetically sealed. The first encapsulant 111 may be placed within the cavity either before the cavity is hermetically sealed or else may be injected into the cavity through an injection port. In an embodiment the first encapsulant 111 may be a molding compound resin such as polyimide, PPS, PEEK, PES, a heat resistant crystal resin, combinations of these, or the like.

Once the first encapsulant 111 has been placed into the cavity such that the first encapsulant 111 encapsulates the region around the first substrate 103 and the first semiconductor device 101, the first encapsulant 111 may be cured in order to harden the first encapsulant 111 for optimum protection. While the exact curing process is dependent at least in part on the particular material chosen for the first encapsulant 111, in an embodiment in which molding compound is chosen as the first encapsulant 111, the curing could occur through a process such as heating the first encapsulant 111 to between about 100° C. and about 130° C., such as about 125° C. for about 60 sec to about 3000 sec, such as about 600 sec. Additionally, initiators and/or catalysts may be included within the first encapsulant 111 to better control the curing process.

However, as one having ordinary skill in the art will recognize, the curing process described above is merely an exemplary process and is not meant to limit the current embodiments. Other curing processes, such as irradiation or even allowing the first encapsulant 111 to harden at ambient temperature, may alternatively be used. Any suitable curing process may be used, and all such processes are fully intended to be included within the scope of the embodiments discussed herein.

In an embodiment the first external connections 113 may be formed to provide an external connection between the first substrate 103 and, e.g., second contact pads 217 (not illustrated in FIG. 1 but illustrated and described below with respect to FIGS. 2A-2B). The first external connections 113 may be contact bumps such as microbumps or controlled collapse chip connection (C4) bumps and may comprise a material such as tin, or other suitable materials, such as silver or copper. In an embodiment in which the first external connections 113 are tin solder bumps, the first external connections 113 may be formed by initially forming a layer of tin through any suitable method such as evaporation, electroplating, printing, solder transfer, ball placement, etc, to a thickness of, e.g., about 100 μm. Once a layer of tin has been formed on the structure, a reflow is performed in order to shape the material into the desired bump shape.

FIG. 2A illustrates an intermediate product in a process of forming, e.g., a second package 200, such as an integrated fan out (InFO) package. As illustrated in FIG. 2A, the intermediate structure comprises a carrier substrate 201, an adhesive layer 202, a polymer layer 205, a seed layer 207, vias 209, a second semiconductor device 211, a second encapsulant 213, a first redistribution layer 215, second contact pads 217, and a first passivation layer 219. The carrier substrate 201 comprises, for example, silicon based materials, such as glass or silicon oxide, or other materials, such as aluminum oxide, combinations of any of these materials, or the like. The carrier substrate 201 is planar in order to accommodate an attachment of semiconductor devices such as the second semiconductor device 211.

The adhesive layer 202 is placed on the carrier substrate 201 in order to assist in the adherence of overlying structures (e.g., the polymer layer 205). In an embodiment the adhesive layer 202 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 202 may be placed onto the carrier substrate 201 in a semi-liquid or gel form, which is readily deformable under pressure.

The polymer layer 205 is placed over the adhesive layer 202 and is utilized in order to provide protection to, e.g., the second semiconductor device 211 once the second semiconductor device 211 has been attached. In an embodiment the polymer layer 205 may be polybenzoxazole (PBO), although any suitable material, such as polyimide or a polyimide derivative, may alternatively be utilized. The polymer layer 205 may be placed using, e.g., a spin-coating process to a thickness of between about 2 μm and about 15 μm, such as about 5 μm, although any suitable method and thickness may alternatively be used.

The seed layer 207 is a thin layer of a conductive material that aids in the formation of a thicker layer during subsequent processing steps. The seed layer 207 may comprise a layer of titanium about 1,000 Å thick followed by a layer of copper about 5,000 Å thick. The seed layer 207 may be created using processes such as sputtering, evaporation, or PECVD processes, depending upon the desired materials. The seed layer 207 may be formed to have a thickness of between about 0.3 μm and about 1 μm, such as about 0.5 μm.

Once the seed layer 207 has been formed, a photoresist (not illustrated in FIG. 2A) may be placed and patterned over the seed layer 207. In an embodiment the photoresist may be placed on the seed layer 207 using, e.g., a spin coating technique to a height of between about 50 μm and about 250 μm, such as about 120 p.m. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern.

In an embodiment the pattern formed into the photoresist is a pattern for the vias 209. The vias 209 are formed in such a placement as to be located on different sides of subsequently attached devices such as the second semiconductor device 211. However, any suitable arrangement for the pattern of vias 209 may alternatively be utilized.

Once the photoresist has been patterned, the vias 209 are formed within the photoresist. In an embodiment the vias 209 comprise one or more conductive materials, such as copper, tungsten, other conductive metals, or the like, and may be formed, for example, by electroplating, electroless plating, or the like. In an embodiment, an electroplating process is used wherein the seed layer 207 and the photoresist are submerged or immersed in an electroplating solution. The seed layer 207 surface is electrically connected to the negative side of an external DC power supply such that the seed layer 207 functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer 207, acquires the dissolved atoms, thereby plating the exposed conductive areas of the seed layer 207 within the opening of the photoresist.

Once the vias 209 have been formed using the photoresist and the seed layer 207, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the seed layer 207.

After the removal of the photoresist exposes the underlying seed layer 207, these portions are removed. In an embodiment the exposed portions of the seed layer 207 (e.g., those portions that are not covered by the vias 209) may be removed by, for example, a wet or dry etching process. For example, in a dry etching process reactants may be directed towards the seed layer 207, using the vias 209 as masks. Alternatively, etchants may be sprayed or otherwise put into contact with the seed layer 207 in order to remove the exposed portions of the seed layer 207. After the exposed portion of the seed layer 207 has been etched away, a portion of the polymer layer 205 is exposed between the vias 209.

After the vias 209 have been formed, the second semiconductor device 211 may be placed on the exposed polymer layer 205. In an embodiment the second semiconductor device 211 may be similar to the first semiconductor device 101, such as by being a logic die, a memory die, a CPU die, combinations of these, or the like. In an embodiment the second semiconductor device 211 is designed and manufactured to work either with or concurrently with the first semiconductor device 101. The second semiconductor device 211 may be attached to the polymer layer 205 using, e.g., an adhesive material, although any suitable method of attachment may alternatively be utilized.

In an embodiment the second semiconductor device 211 comprises a second substrate 221, active devices (not separately illustrated), second metallization layers 223, a second passivation layer 225, and second contact pads 227. The second substrate 221 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices within the second semiconductor device 211 comprise a wide variety of active devices and passive devices such as capacitors, resistors, inductors and the like that may be used to generate the desired structural and functional desires of the design for the second semiconductor device 211. The active devices within the second semiconductor device 211 may be formed using any suitable methods either within or else on the second substrate 221.

The second metallization layers 223 are formed over the second substrate 221 and the active devices within the second semiconductor device 211 and are designed to connect the various active devices within the second semiconductor device 211 to form functional circuitry. In an embodiment the second metallization layers 223 are formed of alternating layers of dielectric and conductive material and may be formed through any suitable process (such as deposition, damascene, dual damascene, etc.). While illustrated in FIG. 2A as a single layer, in an embodiment there may be four layers of metallization separated from the second substrate 221 by at least one interlayer dielectric layer (ILD), but the precise number of second metallization layers 223 is dependent upon the design of the second semiconductor device 211.

The second contact pads 227 may be formed over and in electrical contact with the second metallization layers 223. The second contact pads 227 may comprise aluminum, but other materials, such as copper, may alternatively be used. The second contact pads 227 may be formed using a deposition process, such as sputtering, to form a layer of material (not shown) and portions of the layer of material may then be removed through a suitable process (such as photolithographic masking and etching) to form the second contact pads 227. However, any other suitable process may be utilized to form the second contact pads 227. The second contact pads 227 may be formed to have a thickness of between about 0.5 µm and about 4 µm, such as about 1.45 µm.

The second passivation layer 225 may be formed on the second substrate 221 over the second metallization layers 223 and the second contact pads 227. The second passivation layer 225 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The second passivation layer 225 may be formed through a process such as chemical vapor deposition (CVD), although any suitable process may be utilized, and may have a thickness between about 0.5 µm and about 5 µm, such as about 9.25 KÅ. Once in place the second contact pads 227 may be exposed by removing a portion of the second passivation layer 225 through a process such as chemical mechanical polishing (CMP) although any suitable removal process may be used.

Once the second semiconductor device 211 has been placed between the vias 209, the second semiconductor device 211 and the vias 209 may be encapsulated with a second encapsulant 213. The encapsulation may be performed in a molding device (not individually illustrated in FIG. 2A). For example, the second semiconductor device 211 and the vias 209 may be placed within a cavity of the molding device, and the cavity may be hermetically sealed. The second encapsulant 213 may be placed within the cavity either before the cavity is hermetically sealed or else may be injected into the cavity through an injection port. In an embodiment the second encapsulant 213 may be a molding compound resin such as polyimide, PPS, PEEK, PES, a heat resistant crystal resin, combinations of these, or the like.

Once the second encapsulant 213 has been placed into the molding cavity such that the second encapsulant 213 encapsulates the carrier substrate 201, the vias 209, and the second semiconductor device 211, the second encapsulant 213 may be cured in order to harden the second encapsulant 213 for optimum protection. While the exact curing process is dependent at least in part on the particular material chosen for the second encapsulant 213, in an embodiment in which molding compound is chosen as the second encapsulant 213, the curing could occur through a process such as heating the second encapsulant 213 to between about 100° C. and about 130° C., such as about 125° C. for about 60 sec to about 3000 sec, such as about 600 sec. Additionally, initiators and/or catalysts may be included within the second encapsulant 213 to better control the curing process.

However, as one having ordinary skill in the art will recognize, the curing process described above is merely an exemplary process and is not meant to limit the current embodiments. Other curing processes, such as irradiation or even allowing the second encapsulant 213 to harden at ambient temperature, may alternatively be used. Any suitable curing process may be used, and all such processes are fully intended to be included within the scope of the embodiments discussed herein.

Once the second encapsulant 213 has been placed, the second encapsulant 213 is thinned in order to expose the vias 209 and, optionally, the second semiconductor device 211 for further processing. The thinning may be performed, e.g., using a mechanical grinding or chemical mechanical polishing (CMP) process whereby chemical etchants and abrasives are utilized to react and grind away the second encapsulant 213 and the second semiconductor device 211 until the vias 209 and the second semiconductor device 211 have been exposed. As such, the second semiconductor device 211 and the vias 209 may have a planar surface that is also planar with the second encapsulant 213.

However, while the CMP process described above is presented as one illustrative embodiment, it is not intended to be limiting to the embodiments. Any other suitable removal process may alternatively be used to thin the second encapsulant 213 and the second semiconductor device 211 and expose the vias 209. For example, a series of chemical etches may alternatively be utilized. This process and any other suitable process may alternatively be utilized to thin the second encapsulant 213 and the second semiconductor device 211, and all such processes are fully intended to be included within the scope of the embodiments.

The first redistribution layer 215 is utilized to interconnect the second semiconductor device 211, the vias 209 and the first package 100 (see FIG. 1). In an embodiment the first redistribution layer 215 is formed by initially forming a seed layer (not shown) of, e.g., a titanium copper alloy through a suitable formation process such as CVD or sputtering. A photoresist (also not shown) may then be formed to cover the seed layer, and the photoresist may then be patterned to expose those portions of the seed layer that are located where the first redistribution layer 215 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm, and a width of between about 5 μm and about 300 μm, such as about 5 μm. However, while the material and methods discussed are suitable to form the conductive material, these materials are merely exemplary. Any other suitable materials, such as AlCu or Au, and any other suitable processes of formation, such as CVD or PVD followed by a patterning process, may alternatively be used to form the first redistribution layer 215.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the first redistribution layer 215 has been formed, second contact pads 217 are formed in order to electrically interconnect the first redistribution layer 215 to, e.g., the first external connections 113. In an embodiment the second contact pads 217 are similar to the first contact pads 109 (described above with respect to FIG. 1), such as by being aluminum contact pads formed using a deposition process such as sputtering and then patterned. However, the second contact pads 217 may be formed from any suitable material and using any suitable process.

The first passivation layer 219 may be formed over the first redistribution layer 215 and the second contact pads 217 in order to provide protection and isolation for the first redistribution layer 215 and the other underlying structures. In an embodiment the first passivation layer 219 may be polybenzoxazole (PBO), although any suitable material, such as polyimide or a polyimide derivative, may alternatively be utilized. The first passivation layer 219 may be placed using, e.g., a spin-coating process to a thickness of between about 5 μm and about 25 μm, such as about 7 μm, although any suitable method and thickness may alternatively be used. Once in place, the second contact pads 217 may be exposed through the first passivation layer 219 be removing a portion of the first passivation layer 219 through a process such as chemical mechanical polishing (CMP), although any suitable removal process may alternatively be utilized.

FIG. 2B illustrates further processing in the formation of the second package 200. In an embodiment the carrier substrate 201 and the adhesive layer 202 are debonded from the remainder of the structure using, e.g., a thermal process to alter the adhesive properties of the adhesive layer 202. In a particular embodiment an energy source such as an ultraviolet (UV) laser, a carbon dioxide ($CO_2$) laser, or an infrared (IR) laser, is utilized to irradiate and heat the adhesive layer 202 until the adhesive layer 202 loses at least some of its adhesive properties. Once performed, the carrier substrate 201 and the adhesive layer 202 may be physically separated and removed from the structure.

Additionally, once the carrier substrate 201 and the adhesive layer 202 have been removed, the polymer layer 205 may be patterned in order to expose the vias 209 and the second contact pads 227. In an embodiment the polymer layer 205 is patterned by initially applying a photoresist (not individually illustrated in FIG. 2B) to the polymer layer 205 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 205 are removed with, e.g., a dry etch process. However, any other suitable method for patterning the polymer layer 205 may alternatively be utilized.

FIG. 2B also illustrates a formation of third metallization layers 233 in electrical connection with the vias 209 and the second contact pads 227 in order to interconnect the vias 209 and the second contact pads 227 with, e.g., an external device such as a third substrate (not illustrated in FIG. 2B). In an embodiment the third substrate may be, e.g., a printed circuit board that works to interconnect various electrical components to each other in order to provide a desired functionality for a user. Alternatively, the third substrate may be another substrate and comprises multiple conductive layers (not individually illustrated), some of which are inter-layers within the third substrate. These layers may be etched into traces of various widths and lengths and connected through inter-layer vias. Together, the lines and vias may form an electrical network to route DC power, ground, and signals from one side of the third substrate to the other. Those of skill in the art will recognize the third substrate may be fabricated from an organic (laminate) material such as bismaleimide-triazine (BT), a polymer-based material such as liquid-crystal polymer (LCP), a ceramic material such as low-temperature co-fired ceramic (LTCC), a silicon or glass interposer, or the like. Those of skill in the art will also recognize the conductive layers and vias may be formed from any suitable conductive material, such as copper, aluminum, silver, gold, other metals, alloys, combination thereof, and/or the like, and formed by any suitable technique, such as electro-chemical plating (ECP), electroless plating, other deposition methods such as sputtering, printing, and chemical vapor deposition (CVD) methods, or the like.

In some embodiments, the third substrate may include electrical elements, such as resistors, capacitors, signal distribution circuitry, combinations of these, or the like. These electrical elements may be active, passive, or a combination thereof. In other embodiments, the third substrate is free from both active and passive electrical elements therein. All such combinations are fully intended to be included within the scope of the embodiments.

In an embodiment the third metallization layers 233 are formed of alternating layers of dielectric material 235 and conductive material 237, wherein the conductive material 237 is interconnected vertically with vias and may be formed through any suitable process (such as deposition, damascene, dual damascene, etc.). In an embodiment there may be four layers of metallization, but the precise number of third metallization layers 233 is dependent upon the design of the second package 200.

Once the third metallization layers 233 have been formed, third contact pads 249 may be formed to provide an electrical connection between the third metallization layers 233 and, e.g., the second external connections 303. In an embodiment the third contact pads 249 are similar to the first contact pads 109 (described above with respect to FIG. 1). For example, the third contact pads 249 may be aluminum contact pads formed using a deposition and patterning process, although any other suitable process may alternatively be utilized.

Figure 3A:
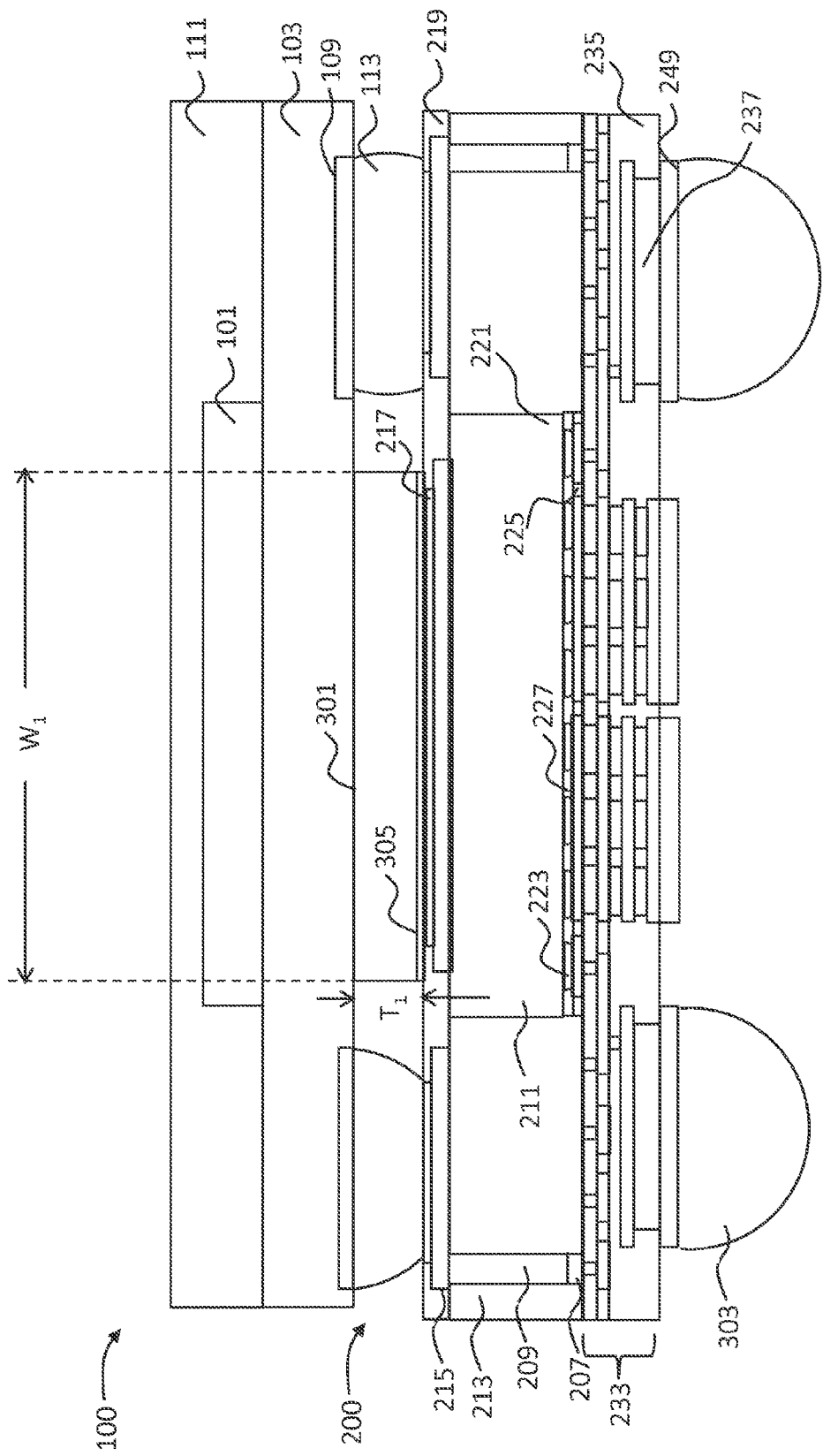
FIGS. 3A-3B illustrate a bonding of the first package to the second package with a block in accordance with some embodiments.

FIG. 3A illustrates a placement of a block 301 and a bonding of the first package 100 and the second package 200. In an embodiment the block 301 is a rigid member made from a solid material that is utilized to provide additional support to the first package 100 and the second package 200 during and after the bonding process, the testing processes, and further manufacturing processes, but which is not used for electrical connectivity, being electrically isolated from the first semiconductor device 101 and the second semiconductor device 221. By providing additional support, less damage will occur due to warping and other stresses that arise during the manufacturing process.

Figure 3B:
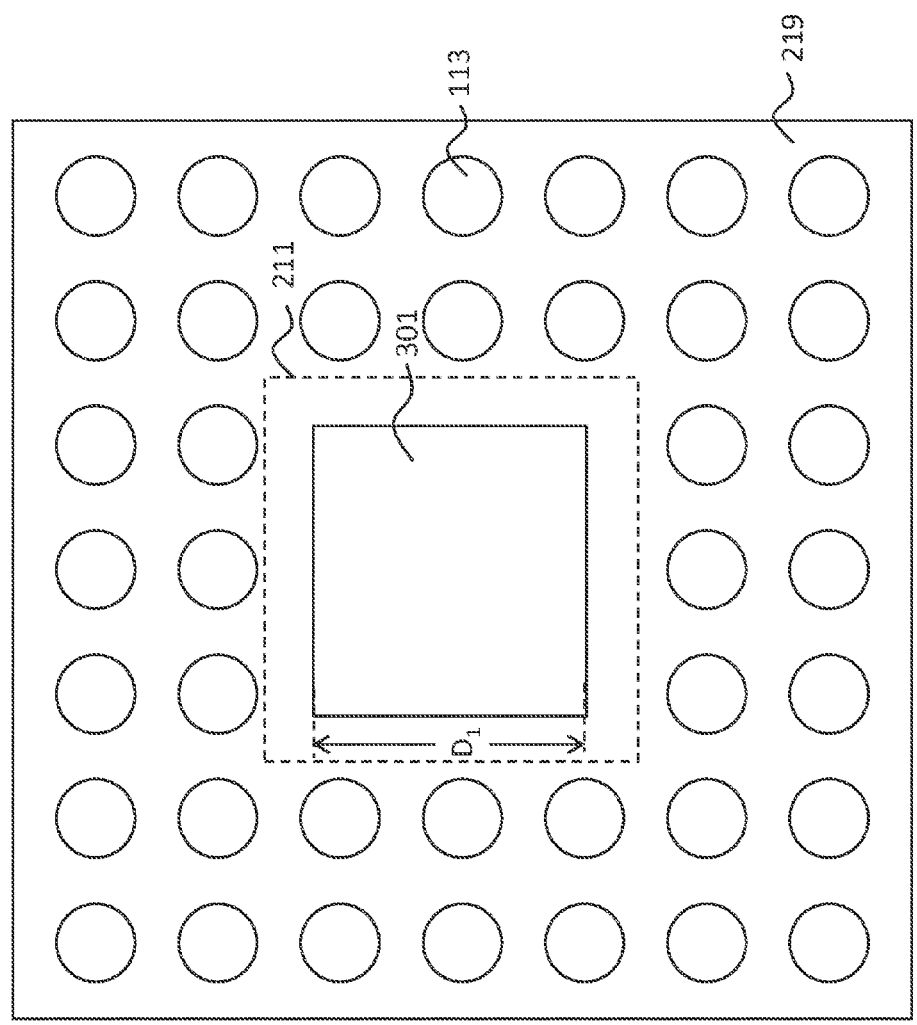

In a particular embodiment the block 301 comprises copper, although any other suitably rigid material, such as aluminum, gold, a polymer such as an epoxy, a packaging substrate (similar to the first substrate 103), or the like, may alternatively be utilized. Additionally, in the embodiment disclosed in FIG. 3A, the block 301 is made of copper and is shaped as a block, with either a shape or dimensions that are different than the first external connections 113. For example, the block 301 may have a first width $W_1$ of between about 1 mm and about 20 mm, such as about 10 mm, and a first depth $D_1$ (not illustrated in the cross-section of FIG. 3A but located so as to go into and out of the page of FIG. 3A, as illustrated in FIG. 3B) of between about 1 mm and about 20 mm, such as about 10 mm. The block 301 has a first thickness $T_1$ that is sufficient to stretch between the first package 100 and the second package 200 and provide the additional structural support. As such, while the precise dimensions of the first thickness $T_1$ are at least in part dependent upon the overall design of the device, in an embodiment the first thickness $T_1$ may be between about 50 µm and about 300 µm, such as about 150 µm.

Additionally, the block 301 is not limited by the block shape as described above and in the figures. Rather, any suitable shapes, such as circles, polygons, and other irregular shapes, such as a cluster of strips or a block with many slots, may also be utilized. All such shapes are fully intended to be included within the scope of the embodiments.

In an embodiment in which the block 301 is a copper block, the block 301 may be placed onto the second contact pads 217 by initially placing solder flux 305 onto the second contact pads 217. The solder flux 305 may be applied by brushing, spraying, a stencil, or other methods, as examples. The solder flux 305 generally has an acidic component that removes oxide barriers, and an adhesive quality that helps to prevent movement during the process. The solder flux 305 may be simultaneously placed on all of the second contact pads 217 (including the ones not being connected to the block 301), although, if desired, the solder flux 305 may only be placed onto the second contact pad 217 connecting to the block 301, or any combinations thereof.

However, while solder flux 305 is described as being used in this embodiment, other types of materials may also be utilized to aid the connection between the block 301 and the second contact pads 217. Any other suitable material, such as a solder paste, an adhesive, or the like, may alternatively be utilized. All such materials are fully intended to be included within the scope of the embodiments.

Once the solder flux 305 is in place, the block 301 may be physically placed in contact with the solder flux 305 using, e.g., a pick and place operation, although any suitable placement methodology may alternatively be utilized. Once the block 301 has been put in place, the first package 100 may be bonded to the second package 200 by initially aligning the first external connections 113 and the second contact pads 217. Once in contact, a reflow may be performed to reflow the material of the first external connections 113 to physically and electrically bond the first package 100 to the second package 200. However, any other suitable method of bonding, such as copper-copper bonding, may alternatively be utilized based upon the chosen structure of the first external connections 113, and all such bonding methods are fully intended to be included within the scope of the embodiments.

Alternatively, instead of being placed on the second contact pads 217, the block 301 may be placed on the first package 100 and then bonded to the second contact pads 217 of the second package 200. Any suitable placement of the block 301 between the first package 100 and the second package 200 may be utilized, and all such placements are fully intended to be included within the scope of the embodiments.

Additionally, as one of ordinary skill in the art will recognize, the above described process of bonding the first package 100 and the second package 200 with the first external connections 113 is only an illustrative embodiment and is not intended to limit the embodiments. Rather, any suitable bonding process, such as using the first external connections 113 on the first contact pads 109 and also using additional external connections (not illustrated in FIG. 3) located on the second contact pads 217 to bond the first package 100 and the second package 200, may alternatively be used. Any suitable method of bonding the first package 100 to the second package 200 may be used, and all such methods are fully intended to be included within the scope of the embodiments.

In one embodiment, once the first package 100 has been bonded to the second package 200, the block 301 will be in physical contact with the first substrate 103. In such an embodiment the block 301 may be attached to the first substrate 103 such as by using an adhesive to attach the block 301 to the first substrate 103. Alternatively, in an embodiment in which the first substrate 103 has one of the first contact pads 109 in a location to contact the block 301, the block 301 may be attached to the first contact pad 109 in a similar fashion as the second contact pad 217, such as by using a solder flux to adhere the materials.

In another embodiment, the block 301 may not directly contact the first package 100, and a small gap may be located between the block 301 and the first package 100. In this embodiment the block 301 is not adhered to the first package 100, but will still provide additional support when the second package 200 flexes, thereby bringing the block 301 into the contact with the first substrate 103 and providing additional structural support during the flexing of the second package 200. The gap may be between about 20 μm and about 120 μm, such as about 70 μm.

FIG. 3A also illustrates the formation of second external connections 303 in connection with the third contact pads 249. The second external connections 303 may be contact bumps such as a ball grid array, although any suitable shape and size, such as microbumps, C4 bumps, or the like, may alternatively be utilized. In an embodiment the second external connections 303 comprise a material such as tin, silver, or copper, although any other suitable material may alternatively be utilized. In an embodiment in which the second external connections 303 are tin solder bumps, the second external connections 303 may be formed by initially forming a layer of tin through any suitable method such as evaporation, electroplating, printing, solder transfer, ball placement, etc, to a thickness of, e.g., about 100 μm. Once a layer of tin has been formed on the structure, a reflow is performed in order to shape the material into the desired bump shape.

FIG. 3B illustrates an expanded top down view (with additional ones of the first external connections 113 illustrated) of the first passivation layer 219, the first external connections 113 and the block 301, with the second semiconductor device 211 illustrated as a dashed box for convenience. As can be seen in this embodiment, the block 301 is located within a center of the second semiconductor device 211 (when viewed from this perspective), while the first external connections 113 surround the block 301 to provide signal connectivity between the first package 100 and the second package 200.

By placing the block 301 between the first package 100 and the second package 200, the block 301 may be utilized as a supporting structure that adds additional structural support to both the first package 100 and the second package 200. By adding additional support, the block 301 can reduce the buildup of stresses and reduce the amount of warpage within the first package 100 and the second package 200 that could lead to testing failures or even structural failure during processes such as bonding, testing, and other manufacturing processes after the first package 100 has been bonded to the second package 200. As such, the block 301 can increase the overall yield of the devices.

Figure 4:
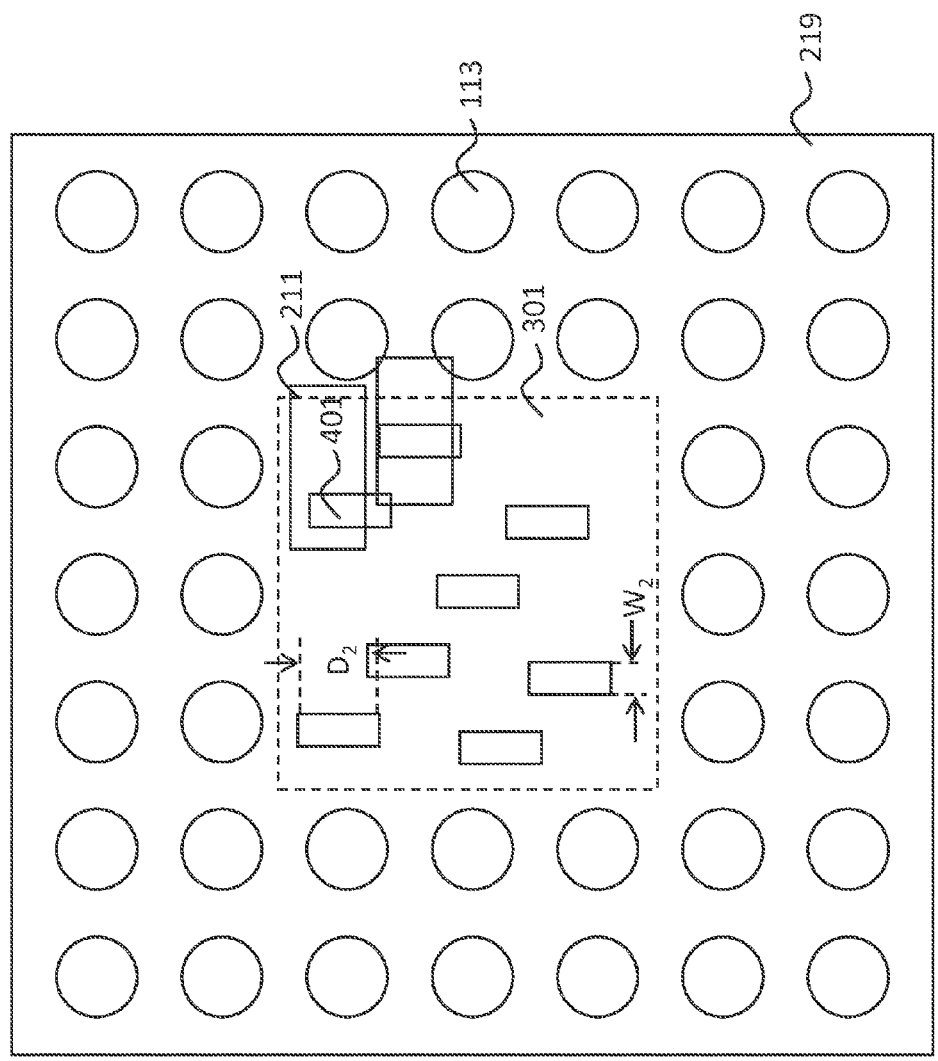
FIG. 4 illustrates slots formed within the block in accordance with some embodiments.

FIG. 4 illustrates another embodiment in which the block 301 further comprises slots 401 in order to help compensate for stresses within the block 301 that will be generated during the manufacturing, testing, and bonding processes and allow the block 301 to flex slightly, allowing for a better fit with the first package 100 and the second package 200. In an embodiment the slots 401 are openings within the block 301, and may be formed using a process such as masking and plating during formation of the block 301, photolithographic masking and etching after formation, or the like. In an embodiment the individual slots 401 may be formed to have a second depth $D_2$ of between about 1 mm and about 10 mm, such as about 5 mm, and a second width $W_2$ of between about 0.5 mm and about 5 mm, such as about 2.5 mm.

In an embodiment the slots 401 may extend all of the way through the block 301. As such, the slots 401 may have a second thickness that is the same as the first thickness $T_1$ of the block 301. However, in other embodiments the slots 401 may not extend of the way through the block 301, and the second thickness is less than the first thickness $T_1$. Any suitable dimensions for the slots 401 may be utilized to help the block 301 be more flexible during the processes and provide better support between the first package 100 and the second package 200.

Additionally, while eight slots 401 are illustrated in FIG. 4 within the block 301, this is intended to be illustrative and is not intended to be limiting to the embodiments. Rather, any suitable number of slots 401, such as between about 2 and about 20, such as 10 slots, may alternatively be utilized. All suitable number and placement of slots 401 are fully intended to be included within the scope of the embodiments.

Figure 5A:
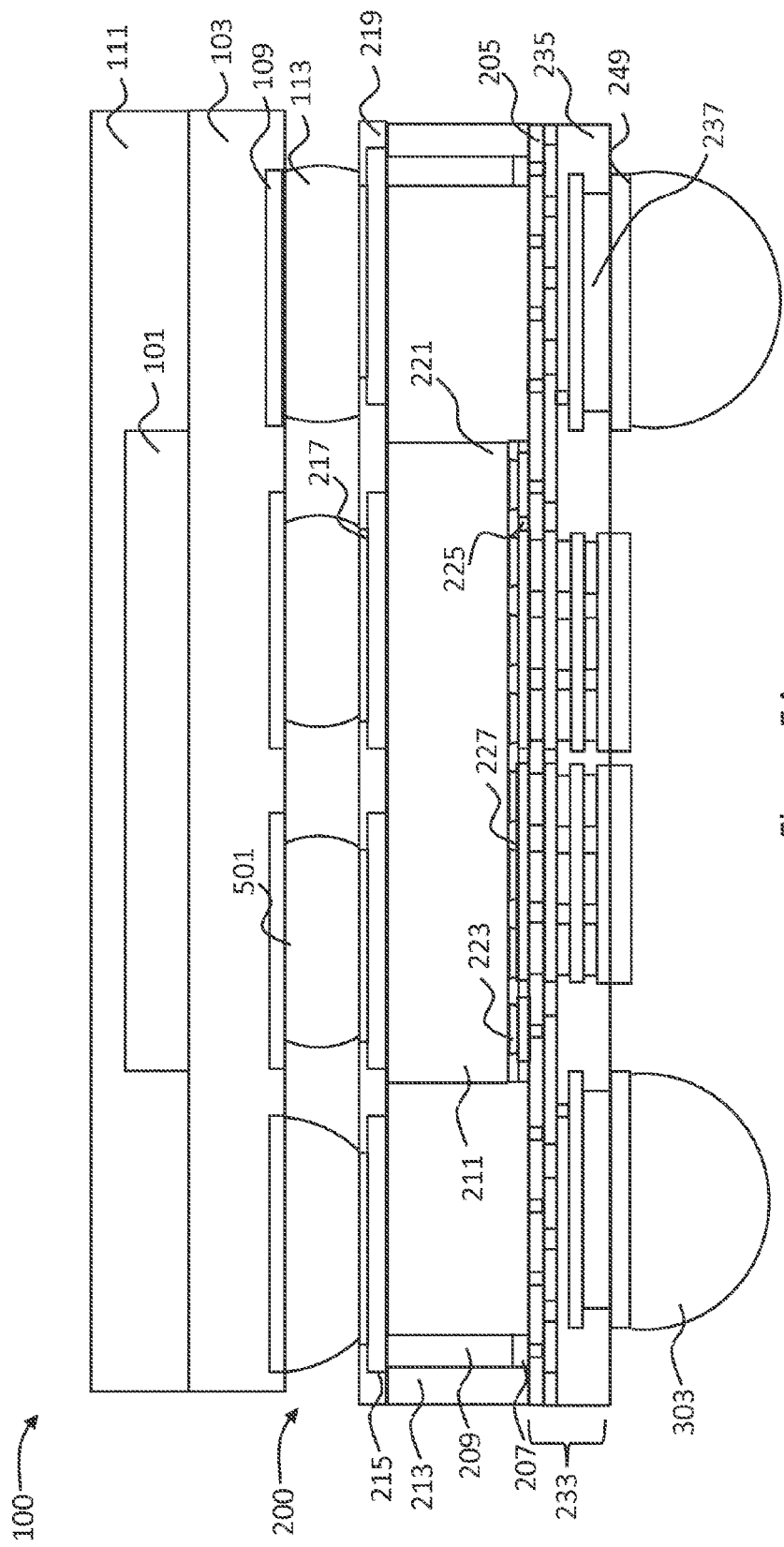
FIGS. 5A-5B illustrate a bonding of the first package to the second package with conductive balls in accordance with some embodiments.

FIG. 5A illustrates another embodiment in which the block 301, rather than being a conductive block, is one or more solid balls 501. In this embodiment, the one or more solid balls 501 may be, e.g., solder balls, although any suitably conductive and stiffening material may alternatively be utilized. In such an embodiment, the one or more solid balls 501 are placed on the first contact pads 109 of the first package 100 during the same process as the first external connections 113, using a process such as forming a layer of solder through printing and then reflowing the solder into a desired bump shape.

However, in an embodiment the one or more solid balls 501 may have a smaller diameter than the first external connections 113. For example, in an embodiment in which the first external connections 113 have a diameter of between about 350 μm and about 150 μm, such as about 250 μm, the one or more solid balls 501 have a smaller diameter, such as between about 300 μm and about 100 μm, such as about 200 p.m. Once in place on the first package 100, the one or more solid balls 501 may be placed in contact to the second contact pads 217 on the second package 200 in a similar fashion as the first external connections 113, such as by performing a reflow.

Figure 5B:
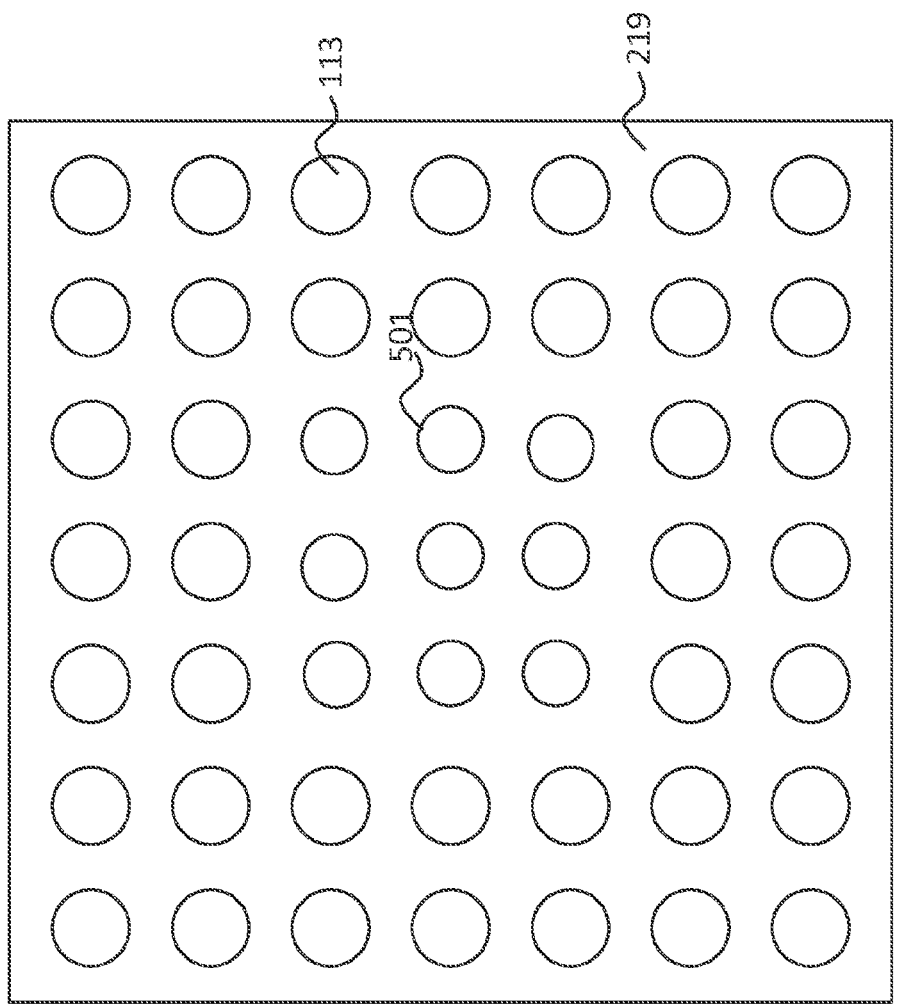

FIG. 5B illustrates a top down view of an arrangement of the one or more solid balls 501. In an embodiment the one or more solid balls 501 are arranged in an array which is surrounded by the larger first external connections 113. However, any suitable placement of the one or more solid balls 501 may alternatively be utilized, and all such placements are fully intended to be included within the scope of the embodiments.

Additionally, while the one or more solid balls 501 are illustrated in FIG. 5B as being nine solid balls 501, this is intended to be illustrative and is not intended to be limiting. Rather, any suitable number of one or more solid balls 501, such as from 1 to 100 solid balls 501, may alternatively be used. Any suitable number of one or more solid balls 501 may be utilized, and all such number are fully intended to be included within the scope of the embodiments.

Figure 6:
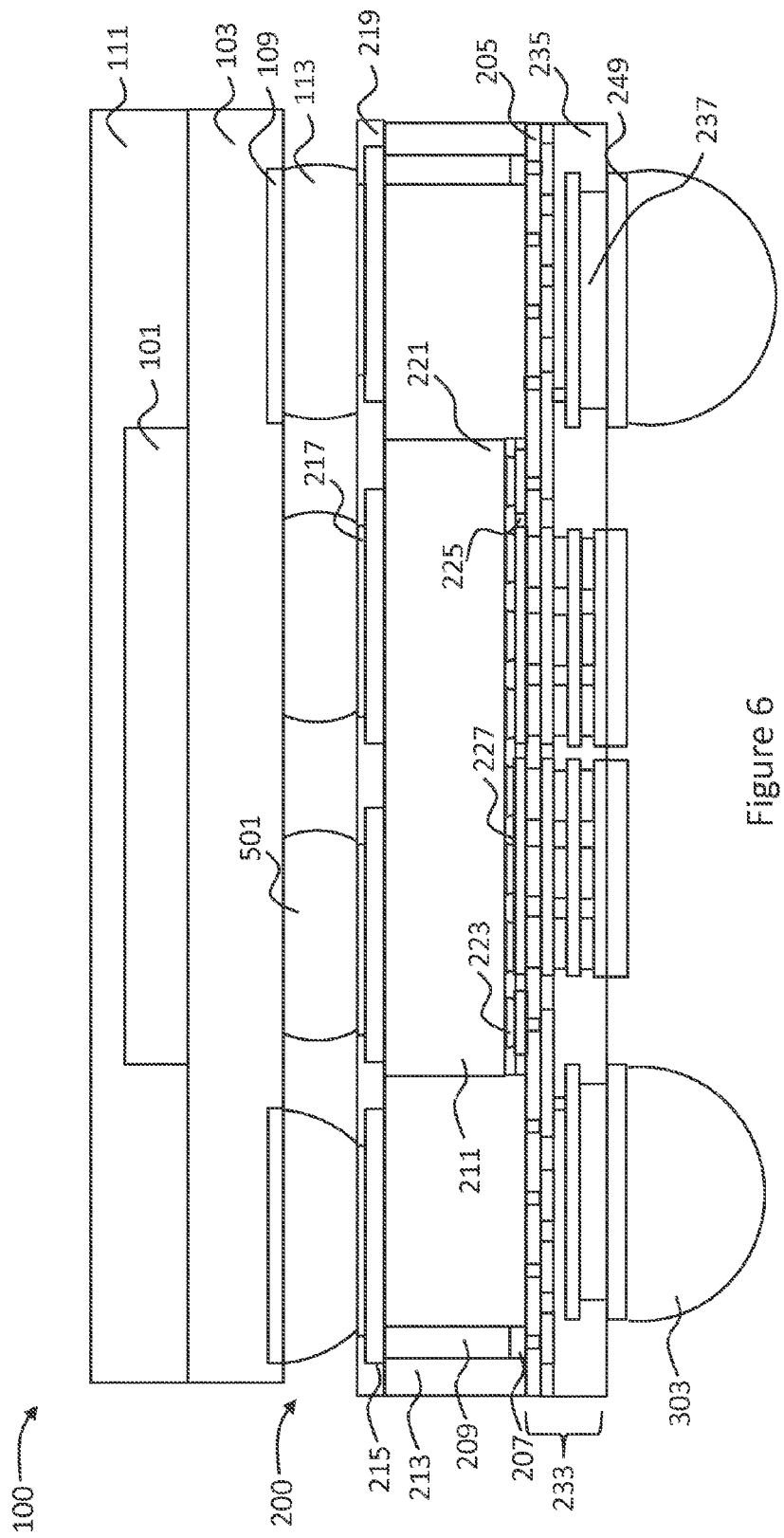
FIG. 6 illustrates another embodiment of bonding the first package to the second package with conductive balls with first contact pads in accordance with some embodiments.

FIG. 6 illustrates yet another embodiment in which the one or more solid balls 501, instead of being placed in contact with the first contact pads 109 on the first package 100, are instead placed directly in contact directly with the first substrate 103. In this embodiment the one or more solid balls 501 are physically placed on the first substrate 103 while the first external connections 113 are placed in contact with the first contact pads 109. The first external connections 113 and the one or more solid balls 501 are then placed in physical contact with the second contact pads 217 and a reflow is performed to bond the first external connections 113 and the one or more solid balls 501 to the second package 200.

Figure 7:
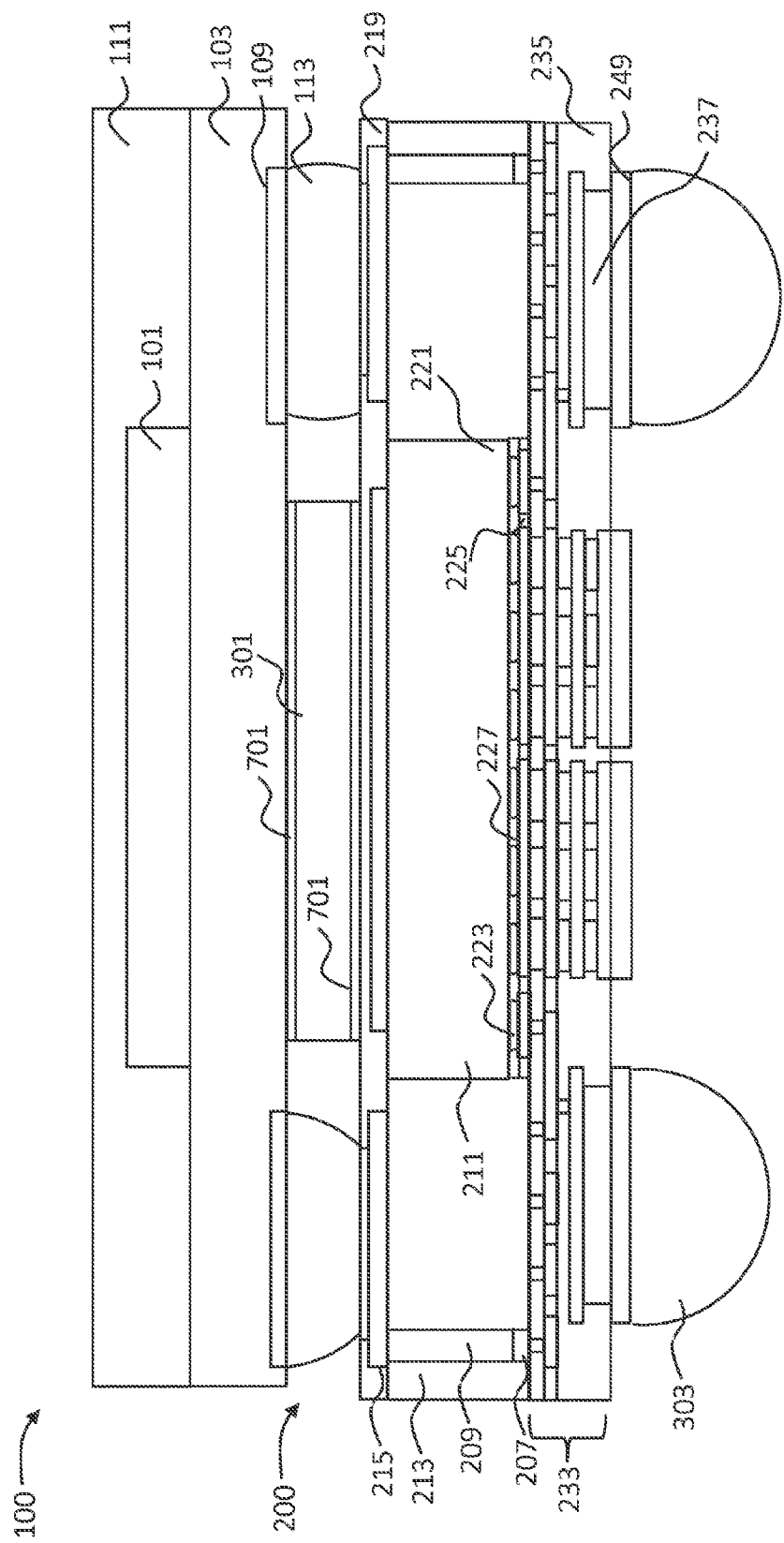
FIG. 7 illustrates another embodiment in which the metal block 301 is attached on the surface of the second package in accordance with some embodiments.

FIG. 7 illustrates yet another embodiment in which the metal block 301 is directly adhered to both the first package 100 and the second package 200 using an adhesive 701. In this embodiment, the second contact pads 217 may or may not be present where the metal block 301 is to be attached (in FIG. 7 the second contact pads 217 have been removed), and the metal block 301 is adhered to the first package 100 and the second package using, e.g., the adhesive 701. In an embodiment the adhesive 701 may be similar to the adhesive layer 202 (described above with respect to FIG. 2), such as by being an ultra-violet glue, a pressure sensitive adhesive, a radiation curable adhesive, an epoxy, or the like. The adhesive 701 may be placed on either the metal block 701, the first package 100, or the second package 200 and is used to adhere the metal block directly to the second package 200.

By utilizing the structural support of the embodiments described herein, the first package 100 and the second package 200 will have additional support that will help reduce or eliminate warpage that can occur during various processes. For example, when testing is performed on the second package 200 through the second external connections 303, the second package 200 will remain more planar, allowing a planar set of probe pins (part of the testing device) to easily make electrical contact with the second external connections 303 during the probing process. As such, with better connectivity, a more thorough test report can be achieved, leading to a more accurate yield.

In accordance with an embodiment, a semiconductor device comprising a first package with a first side and a second package with a second side facing the first side is provided. First external connections electrically connect the first side of the first package and the second side of the second package, and a structural member is between the first package and the second package, wherein the structural member has a different dimension than the first external connections.

In accordance with another embodiment, a semiconductor device comprising a first package with a first side, the first package comprising a first semiconductor device is provided. First external connections are connected to the first side, and a support member is adjacent to the first side, the support member surrounded by the first external connections, wherein the support member is electrically isolated from the first semiconductor device. A second package has a second side facing the first side, the second side connected to the first external connections.

In accordance with yet an embodiment, a method of manufacturing a semiconductor device comprising forming a first external connection on a first side of a first package is provided. A structural member is placed on the first side of the first package, wherein the structural member has a different dimension than the first external connection. The first package is bonded to a second package such that the structural member is between the first package and the second package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a first package with a first side;
    a second package with a second side facing the first side;
    first external connections electrically connecting the first side of the first package and the second side of the second package; and
    a structural member between the first package and the second package, wherein the structural member has a different dimension than the first external connections, wherein the structural member is not in contact with a contact pad of the first package.

2. The semiconductor device of claim 1, wherein the structural member is a block.

3. The semiconductor device of claim 2, wherein the block is a copper block.

4. The semiconductor device of claim 1, wherein the structural member is a first solid ball.

5. The semiconductor device of claim 4, wherein the first solid ball is a solder ball.

6. The semiconductor device of claim 4, wherein the first external connections comprise a second solid ball, the second solid ball having a larger dimension than the first solid ball.

7. The semiconductor device of claim 1, wherein the second package is an integrated fan out package.

8. A semiconductor device comprising:
    a first package with a first side, the first package comprising a first semiconductor device;
    first external connections connected to the first side;
    a support member adjacent to the first side, the support member surrounded by the first external connections, wherein the support member is electrically isolated from the first semiconductor device; and
    a second package with a second side facing the first side, the second side connected to the first external connections.

9. The semiconductor device of claim 8, wherein the support member is a block.

10. The semiconductor device of claim 9, wherein the block is a metal block.

11. The semiconductor device of claim 8, wherein the support member is one or more solid balls.

12. The semiconductor device of claim 11, wherein the one or more solid balls are solder balls.

13. The semiconductor device of claim 11, wherein the first external connections are balls, and wherein the one or more solid balls are smaller than the first external connections.

14. The semiconductor device of claim 8, wherein the second package is an integrated fan out package.

15. A method of manufacturing a semiconductor device, the method comprising:
    forming a first external connection on a first side of a first package;
    placing a structural member on the first side of the first package, wherein the structural member has a different dimension than the first external connection; and
    bonding the first package to a second package such that the structural member is between the first package and the second package.

16. The method of claim 15, wherein the first package is an integrated fan out package.

17. The method of claim 15, wherein the placing the structural member places a metal block.

18. The method of claim 15, wherein the placing the structural member places one or more solid balls.

19. The method of claim 18, wherein the one or more solid balls have a smaller diameter than the first external connection.

20. The semiconductor device of claim 1, wherein the second package is an integrated fan out package.

* * * * *